United States Patent [19]
Wong

[11] Patent Number: 6,075,199
[45] Date of Patent: Jun. 13, 2000

[54] BODY HEAT POWER GENERATOR

[75] Inventor: George S. K. Wong, Gloucester, Canada

[73] Assignee: National Research Council of Canada, Ottawa, Canada

[21] Appl. No.: 09/296,804

[22] Filed: Apr. 23, 1999

Related U.S. Application Data

[60] Provisional application No. 60/083,460, Apr. 29, 1998.

[51] Int. Cl.[7] .................................................. H01L 35/34
[52] U.S. Cl. ......................... 136/201; 136/227; 136/239; 136/240; 136/241; 136/205
[58] Field of Search ..................................... 136/205, 211, 136/212, 225, 226, 239, 240, 241, 236.1, 227, 201

[56] References Cited

U.S. PATENT DOCUMENTS

| | | | |
|---|---|---|---|
| 3,607,445 | 9/1971 | Hines | 136/225 |
| 4,251,290 | 2/1981 | Gomez | 136/206 |
| 4,257,822 | 3/1981 | Gomez | 136/206 |
| 4,444,991 | 4/1984 | Beale | 136/225 |
| 5,086,526 | 2/1992 | Van Marcke | 4/623 |
| 5,517,468 | 5/1996 | Inoue et al. | 310/306 |
| 5,705,770 | 1/1998 | Ogasawara et al. | 136/205 |
| 5,889,735 | 3/1999 | Kawata et al. | 136/205 |

*Primary Examiner*—Kathryn Gorgos
*Assistant Examiner*—Thomas H Parsons
*Attorney, Agent, or Firm*—J. Wayne Anderson

[57] ABSTRACT

A method and apparatus for generating electrical power using animal body heat as the sole energy source. The apparatus includes a plurality of thermocouples connected in series and thermal insulating material for retaining heat in the hot junction and thermal conducting material for conducting heat away from the cold junction whereby a temperature differential between the hot and cold junctions of the thermocouples is maintained body heat energy received by the hot junction is converted to electrical power. The apparatus can be used to replace or supplement the electrical power provided by a low-voltage battery to drive a microelectronic device.

11 Claims, 2 Drawing Sheets

BODY HEAT POWER GENERATOR

This application claims benefit of Provisional Application Ser. No. 60/083,460, filed Apr. 29, 1998.

BACKGROUND OF THE INVENTION

1. Field of the Invention

This invention relates to a method for the production of electrical power from body heat, and to a device used therefor.

Such a method and device can be used to power microelectronic devices, or to replace or supplement a low-voltage battery in such devices. Microelectronic devices of this type include hearing aids, pacemakers, nanomotors and the like.

2. Description of the Prior Art

Devices are known which detect body heat, to actuate a mechanical device. For example, in U.S. Pat. No. 5,086,526 such a device is disclosed which actuates a flow control valve.

SUMMARY OF THE INVENTION

According to one aspect of the invention, an apparatus is provided for generating electrical power using animal body heat as the sole energy source, comprising a thermopile including a plurality of thermocouples connected in series, each thermocouple having a hot junction for receiving heat energy from an animal body part, a cold junction exposed to the atmosphere and means for maintaining a temperature differential between the hot and cold junctions, and a thin electrically insulating film between the hot junction and the animal body part, whereby body heat energy is converted to electrical power.

According to a further aspect of the invention, an apparatus is provided for replacing or supplementing the electrical power provided by a low-voltage battery to drive a microelectronic device, comprising a thermopile as defined above and additionally comprising circuit means electrically connected to said thermopile, said circuit means including the battery, sensor means and switch means, whereby when said sensing means detects insufficient electrical power from the battery to drive the device, the circuit is switched by the switching means to draw electrical power from the thermopile.

According to another aspect of the invention, a method is provided for generating electrical power using animal body heat as the sole energy source, comprising providing a thermopile including a plurality of thermocouples connected in series, each thermocouple having a hot junction for receiving heat energy from an animal body part, a cold junction exposed to the atmosphere and means for maintaining a temperature differential between the hot and cold junctions, and a thin electrically insulating film between the hot and cold junctions, such that body heat energy received by the hot junction is converted to electrical power.

DESCRIPTION OF THE PREFERRED EMBODIMENTS

Figure 1:
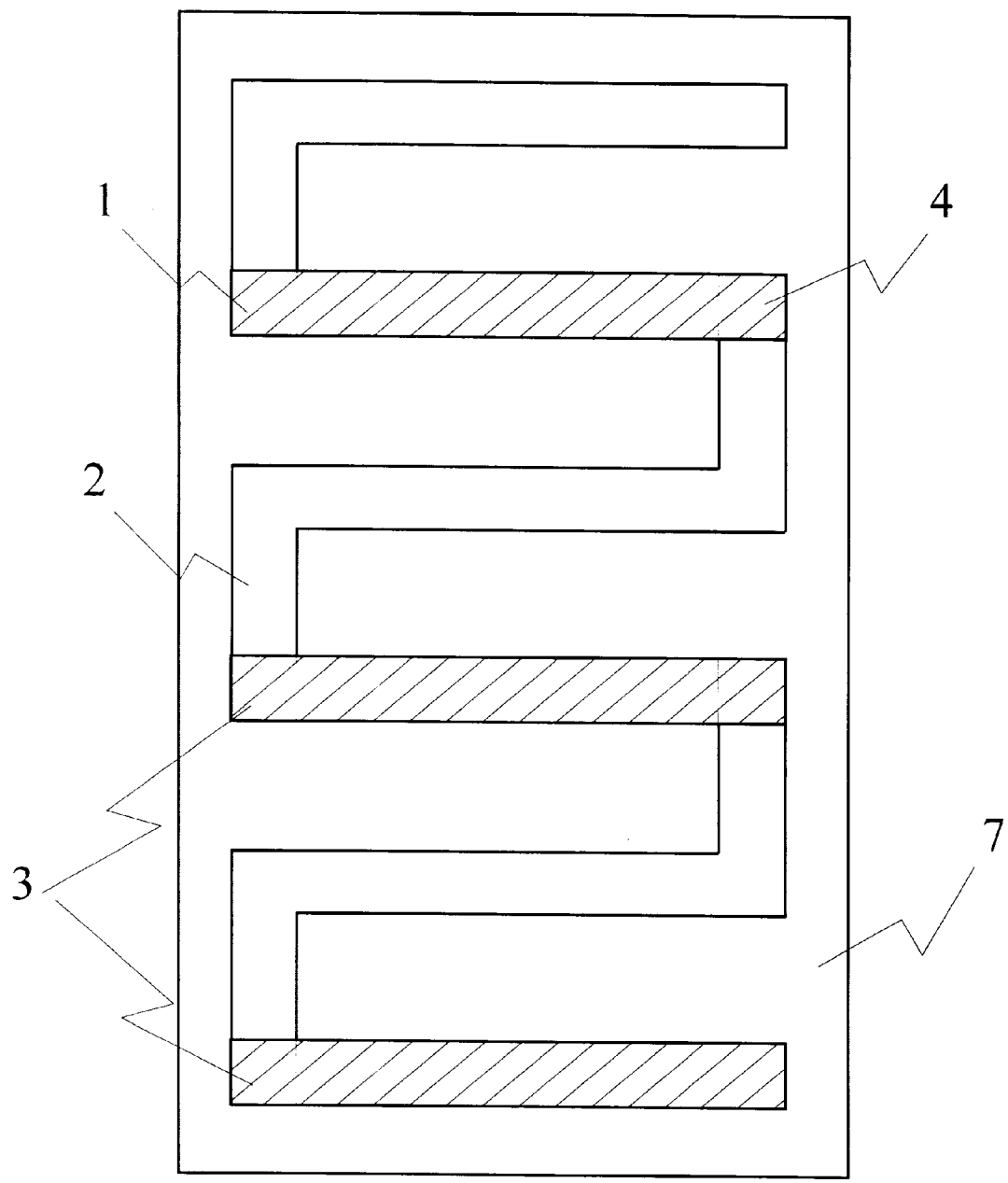
FIG. 1 is a top view schematic diagram of a thermopile sheet, according to the invention.
Figure 2:
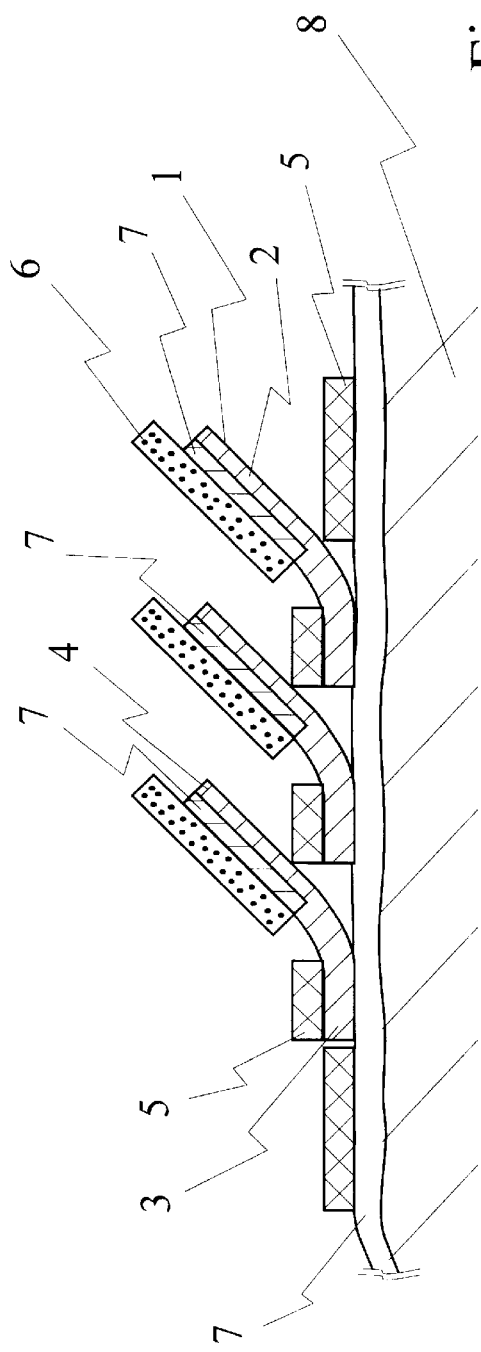
FIG. 2 is an end view schematic of several thermopile sheets connected in a cascade or interleafing arrangement.

As seen in FIGS. 1 and 2, the thermopile comprises a series of thermocouples made from dissimilar metals 1 and 2, for example, copper/constantan (a copper/nickel alloy containing from 40 to 45% nickel, the balance being copper); silicon/germanium or nickel/chromium. Semiconductor materials may also be used. The thermocouples are connected in series in a novel cascading or interleafing arrangement. This is done to minimize space and to permit the stacking of a plurality of thermocouples in a small space. This also facilitates manufacture in a sheet format. It will be appreciated that following assembly, the leaves will lay substantially flat, rather than as shown in FIG. 2.

The thermocouples operate by maintaining a temperature differential between the hot and cold junctions 3 and 4, respectively. This is an application of the Seebeck Effect. Thermal insulating means 5, of low thermal conductivity e.g. in the form of a ceramic film or a ceramic foam is provided to retain the heat in the hot junction. Thermal conducting or heat sink means 6 e.g. in the form of a foil of high thermal conductivity is also provided as shown in FIG. 2 to conduct heat away from the cold junction. This maximizes the temperature differential. When the heat conductor 6 is also electrically conducting, an additional very thin electrically insulating film 7 is provided between the layer 6 and the thermocouples 1,2. When the heat conductor 6 is a non-electrical conductor such as a fiberglas reinforced gel type material, sold under the trademark Heat Path by Raychem, the additional layer 7 is not required. HeatPath includes a pressure sensitive adhesive on one side and is cold-applied after removal of a release film.

Examples of useful thermal conducting foil materials include silver, copper and aluminum.

A very thin electrically insulating film material 7 is interposed between the warm body part 8 and the heat receiving surface of the thermocouple (hot junction) 3, to prevent shorting and to provide protection from damaging the device. HeatPath may be used here, as well.

Examples of other useful insulating materials include, ceramics, titanium, bismuth, polymer films such as Mylar@, being thicker for thermal insulation and thinner for electrical insulation.

Figure 3:
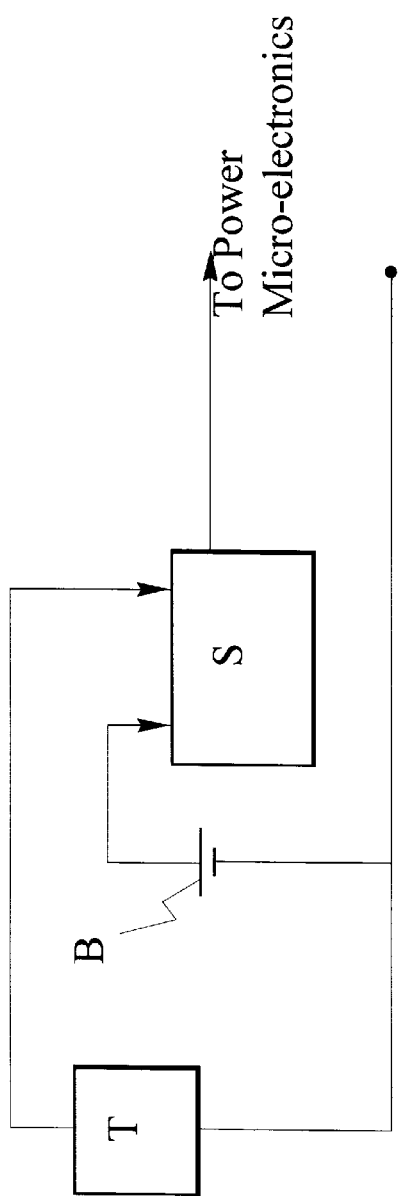
FIG. 3 is a diagram of a circuit, for connection of a thermopile to a microelectronic device.

FIG. 3 illustrates the means for electrically connecting the thermopile T to a circuit means, including a battery, and sensor and switch means S, whereby when the sensing means detects insufficient electrical voltage(and hence insufficient electrical power) from the battery to drive the microelectronic device, the circuit is switched to draw electrical power form the thermopile Other operating modes include:

(a) charge battery when device is not in use.

(b) replace battery, battery on stand by.

EXAMPLE 1

A prototype device has been constructed as follows.

Seventeen copper/constantan thermocouples were connected in series to form a thermopile, with the cold junctions at room temperature (ie. about 21° C.) isolated from the hot junctions with heat insulating foam. The output voltage was measured with a digital voltmeter. By increasing the temperature of the hot junctions, with body heat from the palm of a hand, the temperature of the hot junctions is raised to about 37° C., the voltage output was 10.1 mV.

EXAMPLE 2

The experiment of Example 1 was repeated, but with sixteen junctions, for a temperature difference between the hot and cold junctions of 14.7° C. (room at 22.3° C., and hot junction at 37° C.). The device generated 2.4 microwatts of electrical power at an optimum load resistance of 5.7 ohms. The power output decreases when the load changes. When the hot junction temperature was raised to 46.7° C., the power output increased to 8.4 microwatts.

It is also interesting to note that based upon the assumption of 100 watts heat energy generated by a typical human, and assuming an average skin surface area of 47,000 $cm^2$, the power generated per unit area is approximately 2.1 milliwatts per $cm^2$. Assuming an efficiency of only 1%, this translates into 21 microwatts per $cm^2$. A similar estimation for a black body is approximately 5.8 milliwatts per $cm^2$.

It is also noted that the efficiency may actually range from 2 to 10%, and using conventional engineering techniques a device could be constructed having several thousand junctions per $cm^2$, and the temperature difference between the hot and cold junctions are dependent upon the environment.

What is claimed is:

1. An apparatus for generating electrical power using body heat as the sole energy source, comprising a thermocouple including a plurality of thermocouples connected in series, each thermocouple having a hot junction for receiving heat energy from an animal body part, a cold junction exposed to the atmosphere and means for maintaining a temperature differential between the hot and cold junctions including thermal insulating means for retaining heat in the hot junction and thermal conducting means for conducting heat away from the cold junction.

2. An apparatus according to claim 1, wherein said thermocouples are in the form of sheets of dissimilar metals.

3. An apparatus according to claim 2, wherein the dissimilar metals are selected from the group consisting of copper/constantan, silicon/germanium,nickel/chromium, and semiconductor materials.

4. An apparatus according to claim 1, wherein the thermal insulating means is a sheet material material selected from the group consisting of ceramics, titanium, bismuth, and polymer films.

5. An apparatus according to claim 1, wherein the thermal conducting means is a foil material selected from the group consisting of silver, copper and aluminum and a thin electrically insulating film is provided between the thermal conducting foil and each thermocouple.

6. An apparatus according to claim 1, wherein the thermal conducting means is an electrically insulating material.

7. An apparatus according to claim 1, for replacing or supplementing the electrical power provided by a low-voltage battery to drive a microelectronic device, additionally comprising circuit means electrically connected to said thermopile, said circuit means including the battery and sensor means and switch means, whereby when said sensing means detects insufficient electrical power from the battery to drive the device, the circuit is switched by the switching means to draw electrical power from the thermopile.

8. An apparatus according to claim 1, wherein thermocouples are connected in the form of overlapping leaves, which following assembly lay substantially flat.

9. A method for generating electrical power using animal body heat as the sole energy source, comprising providing a thermopile including a plurality of thermocouples connected in series, each thermocouple having a hot junction for receiving body heat energy from an animal body part, a cold junction exposed to the atmosphere and means for maintaining a temperature differential between the hot and cold junctions including thermal insulating means for retaining heat in the hot junction and thermal conducting means for conducting heat away from the cold junction, and a thin electrically insulating film between the hot junction and the animal body part, such that the body heat energy received by the hot junction is converted to electrical power.

10. A method according to claim 9, wherein said thermocouples are in the form of sheets of dissimilar metals.

11. A method according to claim 10, wherein the dissimilar metals are selected from the group consisting of copper/constantan, silicon/germanium,nickel/chromium and semiconductor materials.

* * * * *